(12) United States Patent
Piazza et al.

(10) Patent No.: US 9,978,764 B2
(45) Date of Patent: May 22, 2018

(54) INTEGRATED CIRCUIT AND METHOD OF MANUFACTURING THE SAME

(71) Applicant: STMicroelectronics (Crolles 2) SAS, Crolles (FR)

(72) Inventors: Fausto Piazza, Grenoble (FR); Sebastien Lagrasta, La Terrasse (FR); Raul Andres Bianchi, Myans (FR); Simon Jeannot, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days. days.

(21) Appl. No.: 15/133,394

(22) Filed: Apr. 20, 2016

(65) Prior Publication Data

US 2017/0186759 A1  Jun. 29, 2017

(30) Foreign Application Priority Data

Dec. 29, 2015  (FR) ..................................... 15 63435

(51) Int. Cl.

| | |
|---|---|
| *H01L 27/115* | (2017.01) |
| *H01L 27/11546* | (2017.01) |
| *H01L 21/02* | (2006.01) |
| *H01L 21/28* | (2006.01) |
| *H01L 21/3205* | (2006.01) |

(Continued)

(52) U.S. Cl.
CPC .... *H01L 27/11546* (2013.01); *H01L 21/0217* (2013.01); *H01L 21/02164* (2013.01); *H01L 21/28035* (2013.01); *H01L 21/28273* (2013.01); *H01L 21/32055* (2013.01); *H01L 21/32133* (2013.01); *H01L 27/0629* (2013.01); *H01L 27/11521* (2013.01); *H01L 28/60* (2013.01); *H01L 29/4916* (2013.01);

(Continued)

(58) Field of Classification Search
None
See application file for complete search history.

(56) References Cited

U.S. PATENT DOCUMENTS

| | | |
|---|---|---|
| 2006/0030112 A1 | 2/2006 | Han et al. |
| 2006/0134874 A1 | 6/2006 | Kamiya |

(Continued)

OTHER PUBLICATIONS

INPI Search Report and Written Opinion for FR 1563435 dated Sep. 12, 2016 (9 pages).

*Primary Examiner* — Abul Kalam
(74) *Attorney, Agent, or Firm* — Crowe & Dunlevy

(57) ABSTRACT

An integrated circuit includes a high-voltage MOS (HV) transistor and a capacitor supported by a semiconductor substrate. A gate stack of the HV transistor includes a first insulating layer over the semiconductor layer and a gate electrode formed from a first polysilicon. The capacitor includes a first electrode made of the first polysilicon and a second electrode made of a second polysilicon and at least partly resting over the first electrode. A first polysilicon layer deposited over the semiconductor substrate is patterned to form the first polysilicon of the gate electrode and first electrode, respectively. A second polysilicon layer deposited over the semiconductor substrate is patterned to form the second polysilicon of the second electrode. Silicon oxide spacers laterally border the second electrode and the gate stack of the HV transistor. Silicon nitride spacers border the silicon oxide spacers.

22 Claims, 7 Drawing Sheets

(51) Int. Cl.

| | | |
|---|---|---|
| *H01L 21/3213* | (2006.01) | |
| *H01L 27/11521* | (2017.01) | |
| *H01L 49/02* | (2006.01) | |
| *H01L 29/49* | (2006.01) | |
| *H01L 29/66* | (2006.01) | |
| *H01L 27/06* | (2006.01) | |
| H01L 21/8234 | (2006.01) | |
| H01L 27/11541 | (2017.01) | |

(52) U.S. Cl.
 CPC .... *H01L 29/6656* (2013.01); *H01L 29/66825* (2013.01); *H01L 21/823468* (2013.01); *H01L 27/11541* (2013.01)

(56) References Cited

U.S. PATENT DOCUMENTS

| | | | | |
|---|---|---|---|---|
| 2009/0273883 | A1* | 11/2009 | Schwantes | H01L 27/0629 361/305 |
| 2010/0032741 | A1 | 2/2010 | Ueno | |
| 2010/0155852 | A1 | 6/2010 | Piazza et al. | |
| 2011/0062507 | A1 | 3/2011 | Wu et al. | |
| 2011/0095348 | A1 | 4/2011 | Chakihara et al. | |
| 2011/0269291 | A1* | 11/2011 | Ueno | H01L 21/28273 438/393 |
| 2012/0034751 | A1* | 2/2012 | Ariyoshi | H01L 21/823462 438/381 |
| 2014/0024183 | A1 | 1/2014 | Hsu et al. | |

\* cited by examiner

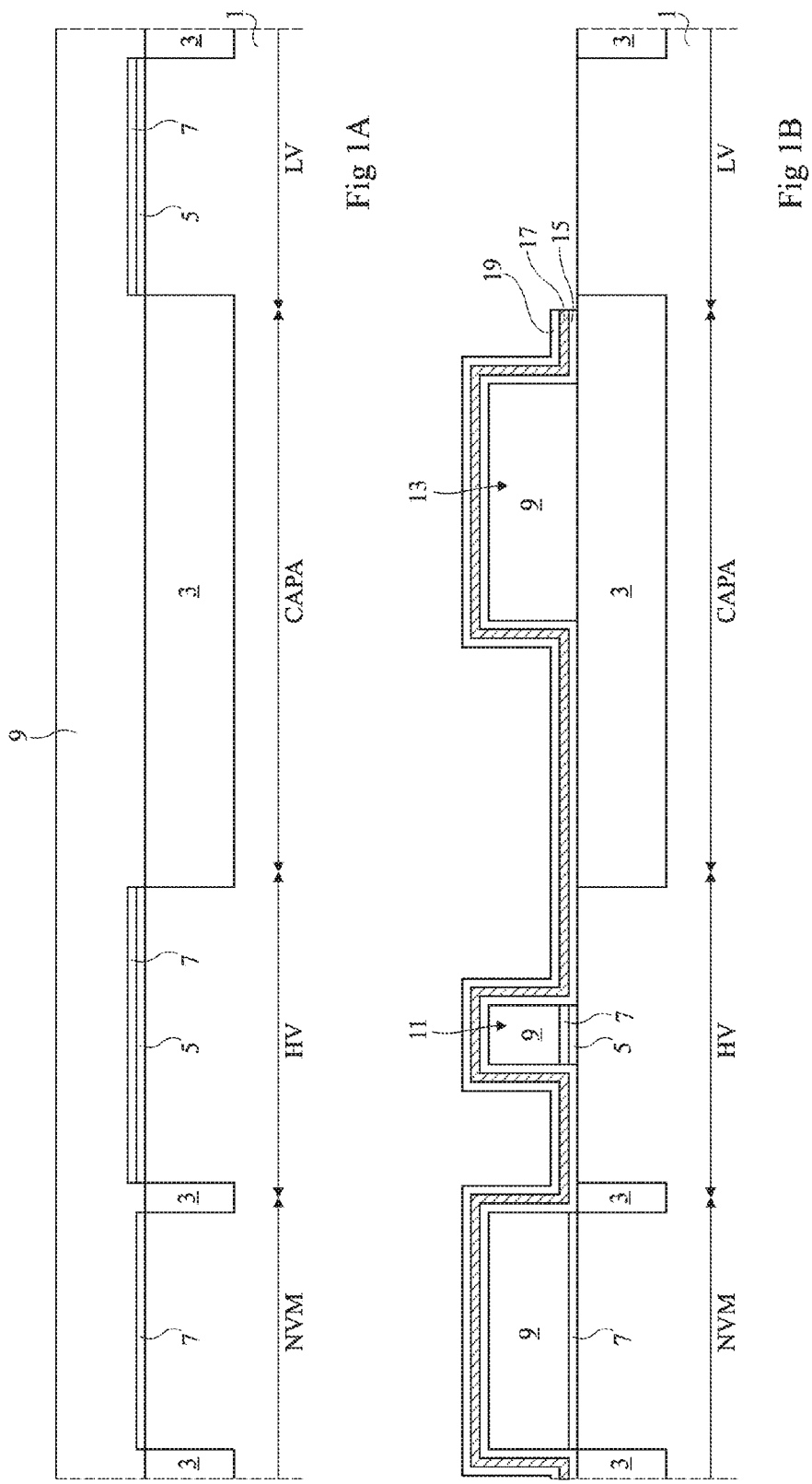

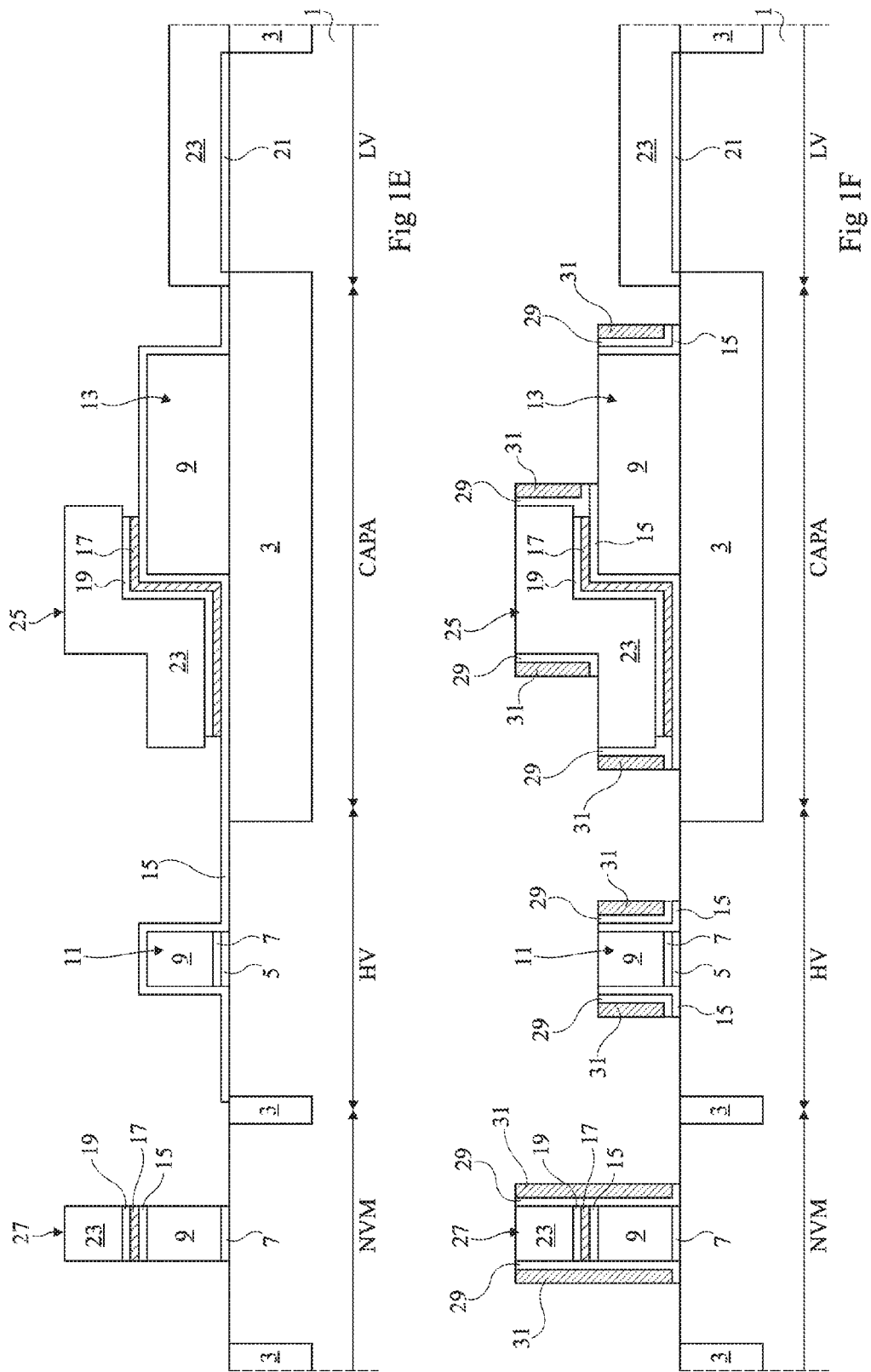

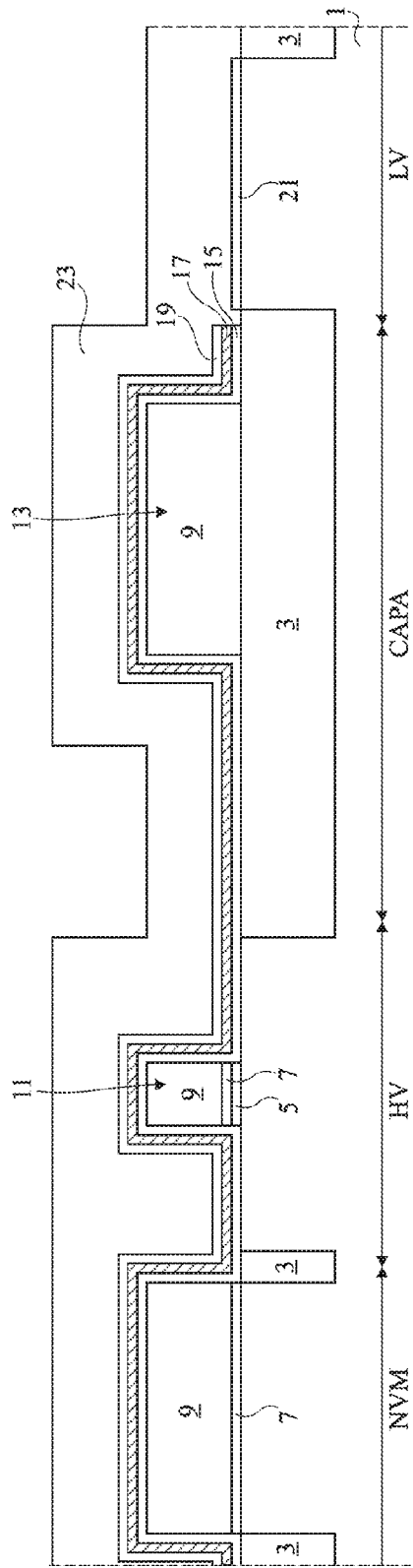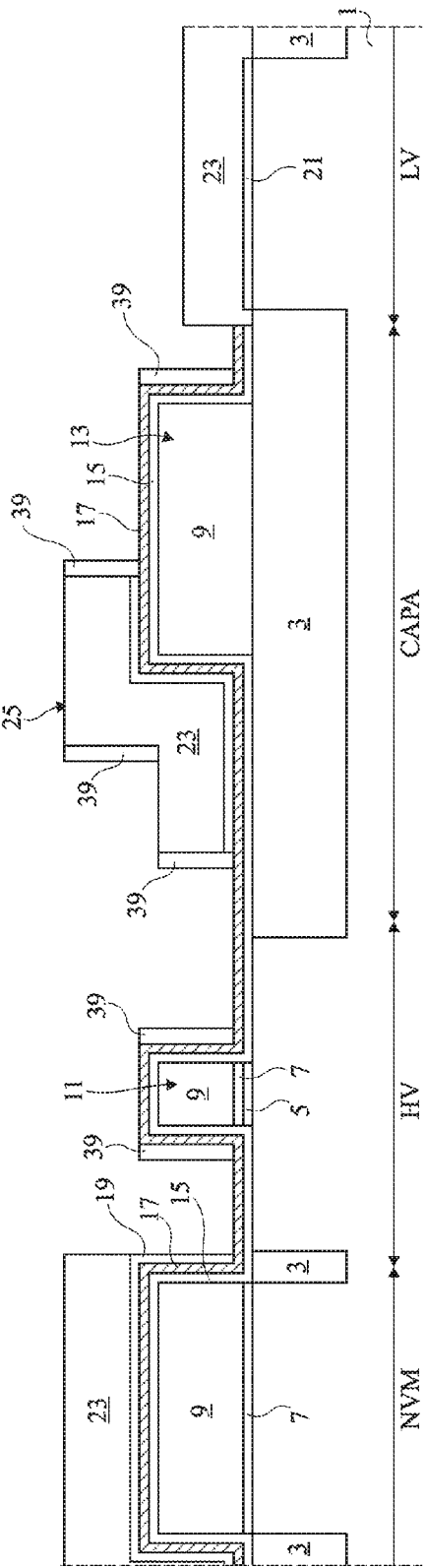

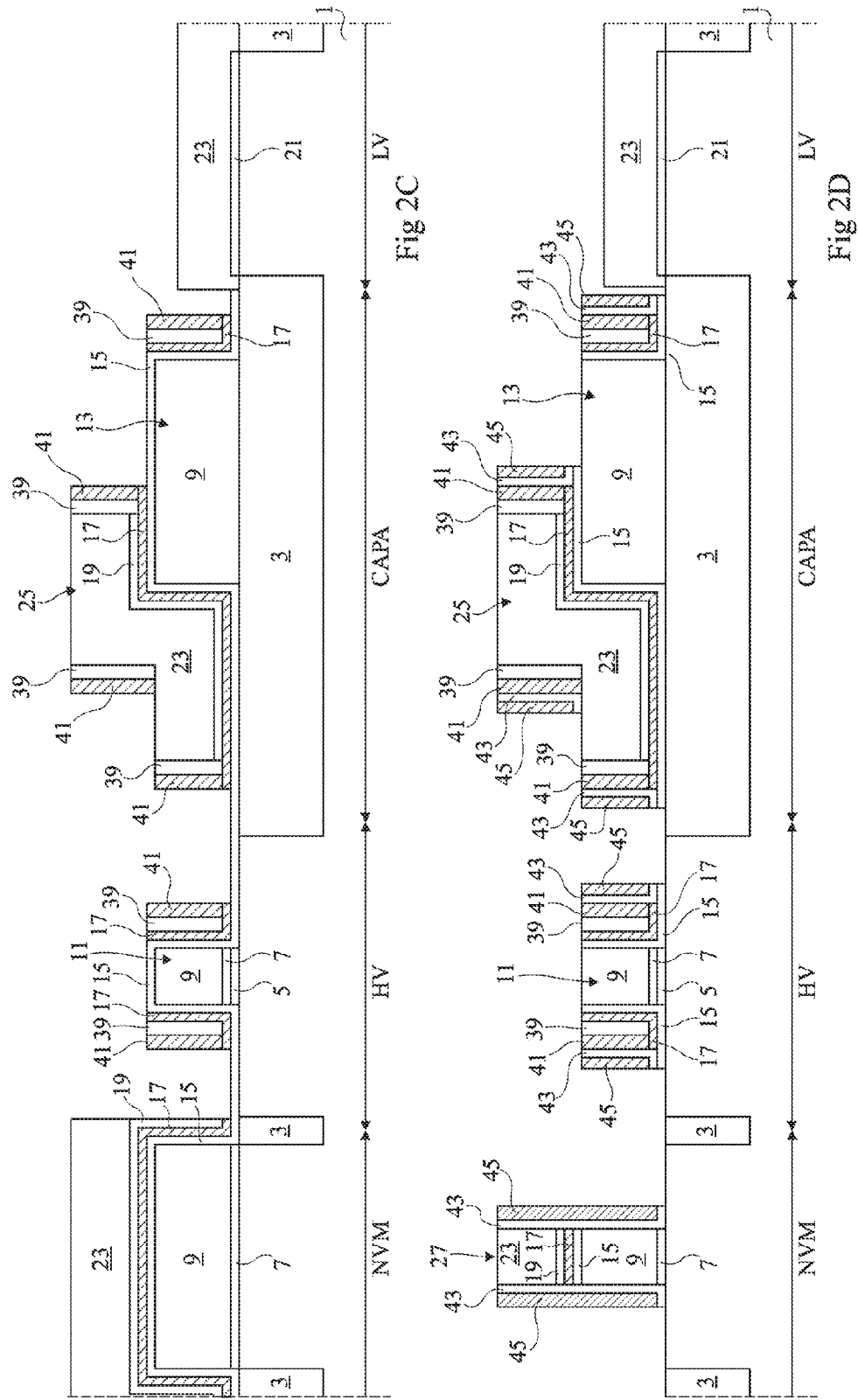

INTEGRATED CIRCUIT AND METHOD OF MANUFACTURING THE SAME

PRIORITY CLAIM

This application claims the priority benefit of French Patent application number 1563435, filed on Dec. 29, 2015, the disclosure of which is hereby incorporated by reference in its entirety to the maximum extent allowable by law.

TECHNICAL FIELD

The present disclosure relates to an integrated circuit and a method of manufacturing the same, the integrated circuit comprising MOS transistors of different types and at least one capacitor.

BACKGROUND

In an integrated circuit, MOS transistors of different types are currently used including, for example, MOS transistors intended to operate at high voltages, or HV transistors, MOS transistors intended to operate at lower voltages, or LV transistors, and floating-gate MOS transistors, or NVM transistors, forming non-volatile memories. The gate stack of an NVM transistor comprises, on a gate insulator, a gate electrode, called "floating gate", topped with another gate electrode, called "control gate", electrically insulated from the floating gate. Generally, such an integrated circuit generally comprises at least one capacitor CAPA for generating high voltages capable of being applied to the control gate, to the drain, or to the source of the NVM transistors.

In the case of an integrated circuit comprising MOS transistors of different types, the number and/or the thickness of the spacers bordering the gate stack of each type of transistor should be selected according to the voltages likely to be applied to this type of transistor.

It would thus be desirable to have a method of manufacturing an integrated circuit comprising MOS transistors of different types associated with different spacers. It would also be desirable for this manufacturing method to enable to form a capacitor capable of delivering high voltages.

SUMMARY

Thus, an embodiment provides a method of manufacturing an integrated circuit comprising at least one high-voltage MOS transistor, HV, and at least one capacitor, CAPA, the method comprising the successive steps of: a) forming, on a semiconductor layer, a first insulating layer at the location of the HV transistor; b) depositing a first polysilicon layer; c) forming a gate stack of the HV transistor and a first electrode of capacitor CAPA by etching the first polysilicon layer; d) successively forming a first silicon oxide layer, a silicon nitride layer, and a second silicon oxide layer; e) depositing a second polysilicon layer; f) forming a second electrode of capacitor CAPA at least partly resting on the first electrode by etching the second polysilicon layer, and removing the exposed portions of the second oxide layer; g) forming first silicon oxide spacers laterally bordering the gate stack of the HV transistor and the first and second electrodes; and h) forming second silicon nitride spacers laterally bordering the gate stack of the HV transistor and the first and second electrodes.

According to an embodiment, the integrated circuit further comprises at least one floating gate MOS transistor, NVM, the method further comprising, at the location of the NVM transistor, the steps of: a1) at step a), forming a second insulating layer on the semiconductor layer; c1) at step c), leaving in place the first polysilicon layer; f1) at step f), leaving in place the second polysilicon layer; i) after step h), forming a gate stack of the NVM transistor by etching the second polysilicon layer, the second oxide layer, the silicon nitride layer, the first oxide layer, and the first polysilicon layer; and j) over the entire integrated circuit, forming third spacers laterally bordering the gate stacks of the HV and NVM transistors and the first and second electrodes.

According to an embodiment, the integrated circuit further comprises at least one low-voltage MOS transistor, LV, the method further comprising, at the location of the LV transistor, the steps of: c2) at step c), removing the first polysilicon layer; d2) at step d), removing the second oxide layer, the nitride layer, and the first oxide layer; e2) at step e), forming, on the semiconductor layer and prior to the forming of the second polysilicon layer, a third insulating layer; f2) at step f), leaving in place the second polysilicon layer; k) after step j), forming a gate stack of the LV transistor by etching the second polysilicon layer; and l) over the entire integrated circuit, forming fourth spacers laterally bordering the gate stacks of the HV, NVM, and LV transistors and the first and second electrodes of capacitor CAPA.

According to an embodiment, an integrated circuit comprises at least one high-voltage MOS transistor, HV, and at least one capacitor, CAPA, wherein: the gate stack of the HV transistor comprises a first insulating layer resting on a semiconductor layer and coated with a first polysilicon; capacitor CAPA comprises a first electrode made of the first polysilicon resting on the semiconductor layer, and a second electrode made of a second polysilicon at least partly resting on the first electrode, a first silicon oxide layer coated with a silicon nitride layer, itself coated with a second silicon oxide layer separating the second electrode from the semiconductor layer and from the first electrode; first silicon oxide spacers laterally border the second electrode and the gate stack of the HV transistor; and second silicon nitride spacers border the first spacers, the first oxide layer and the nitride layer also extending between the first spacers and the gate stack of the HV transistor, and under the first and second spacers.

According to an embodiment, the integrated circuit further comprises at least one floating-gate MOS transistor, NVM, wherein: the gate stack of the NVM transistor comprises a second insulating layer resting on the semiconductor layer and successively coated with the first polysilicon, with the second oxide layer, with the nitride layer, with the first oxide layer, and with the second polysilicon; and third spacers laterally border the gate stack of the NVM transistor and the second spacers.

According to an embodiment, the integrated circuit further comprises at least one low-voltage MOS transistor, LV, wherein: the gate stack of the LV transistor comprises a third insulating layer resting on the semiconductor layer and coated with the second polysilicon; and fourth spacers laterally border the gate stack of the LV transistor and the third spacers.

BRIEF DESCRIPTION OF THE DRAWINGS

The foregoing and other features and advantages will be discussed in detail in the following non-limiting description of specific embodiments in connection with the accompanying drawings, wherein:

FIGS. 1A to 1G illustrate a structure at successive steps of an example of an integrated circuit manufacturing method; and FIGS. 2A to 2E illustrate a structure at successive steps of an embodiment of an integrated circuit manufacturing method.

DETAILED DESCRIPTION

Figure 1C:
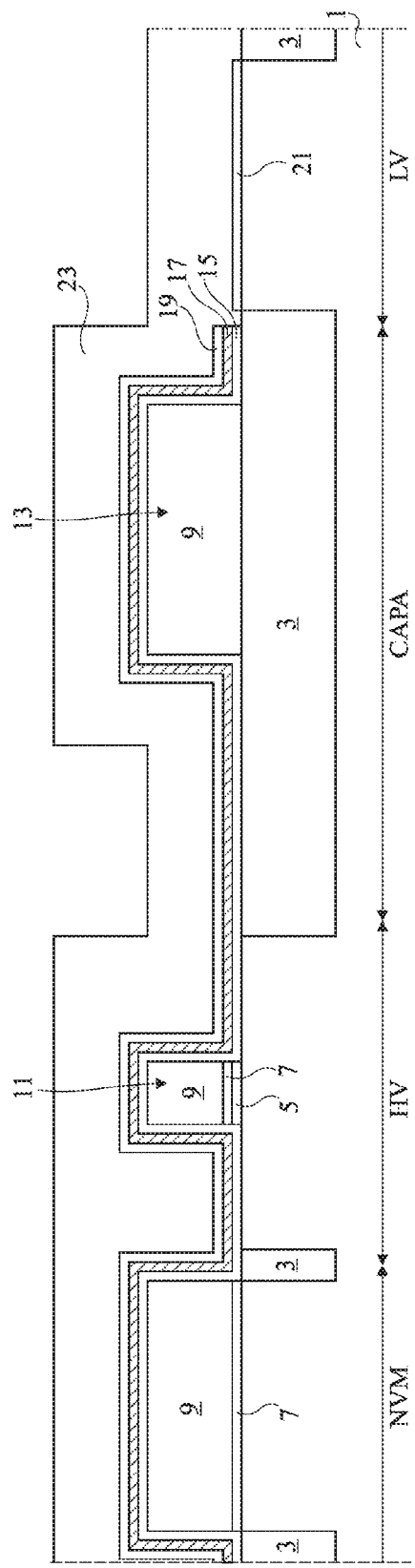

The same elements have been designated with the same reference numerals in the various drawings and, further, the various drawings are not to scale. For clarity, only those elements which are useful to the understanding of the described embodiments have been shown and are detailed. In the following description, terms "over" and "under" refer to the orientation of the concerned elements in the corresponding drawings.

FIGS. 1A to 1G are simplified cross-section views showing a structure at successive steps of an example of a method of manufacturing an integrated circuit comprising various types of transistors and a capacitor.

In FIG. 1A, the structure comprises a semiconductor layer 1, for example, a silicon layer, only a portion thereof being shown. The shown portion comprises a location for a floating-gate MOS transistor, NVM, a location for a high-voltage MOS transistor, HV, a location for a capacitor, CAPA, and a location for a low-voltage MOS transistor, LV. Insulating structures 3, for example, trenches filled with an insulating material, have been formed in semiconductor layer 1 and delimit the locations of the NVM, HV, and LV transistors, and of capacitor CAPA. In this example, one of insulating structures 3 extends under the entire surface of the location of capacitor CAPA. A first gate insulator layer 5 has been formed on semiconductor layer 1 at the location of the HV MOS transistor, and a second gate insulator layer 7 has been formed on semiconductor layer 1 at the location of the NVM transistor. More particularly, in this example, first insulating layer 5 has been formed over the entire exposed surface of semiconductor layer 1 and then removed from the location of the NVM transistor, and second insulating layer 7 has then been formed on semiconductor layer 1 at the location of the NVM transistor, and on layer 5 at the location of the HV and LV transistors. A polysilicon layer 9 has then been deposited over the entire structure.

As an example, layer 5 is a silicon oxide layer capable of having a thickness in the range from 5 to 15 nm, for example, 9 nm. Layer 7 is for example a silicon oxide layer capable of having a thickness in the range from 5 to 10 nm, for example, 9 nm. The thickness of polysilicon layer 9 may be in the range from 100 to 150 nm, for example, 125 nm. Polysilicon 9 may be doped at an implantation step subsequent to its deposition, or in situ as it is being deposited.

FIG. 1B shows the structure of FIG. 1A after gate stack 11 of the HV transistor and of first electrode 13 of capacitor CAPA have been delimited. To achieve this, at the location of the HV transistor, polysilicon layer 9 and gate insulator layers 7 and 5 are removed by etching while portions of these layers corresponding to gate stack 11 are left in place and, at the location of capacitor CAPA, polysilicon layer 9 is removed by etching while a portion of this layer corresponding to electrode 13 is left in place. Layers 9, 7, and 5 are also removed by etching at the location of the LV transistor, and left in place at the location of the NVM transistor. This etch step is carried out simultaneously at the locations of capacitor CAPA and of the HV and LV transistors. The etch step is followed by the successive forming, over the entire structure, of a silicon oxide layer 15, of a conformal silicon nitride layer 17, and of a conformal silicon oxide layer 19. Layers 15, 17, and 19 are then removed by etching at the location of the LV transistor.

As an example, the thickness of oxide layer 15 is in the range from 3 to 20 nm, for example, 4 nm. The thickness of nitride layer 17 may be in the range from 2 to 5 nm, for example, 3.5 nm. The thickness of oxide layer 19 may be in the range from 2 to 10 nm, for example, 4 nm.

FIG. 1C shows the structure of FIG. 1B after the forming of a gate insulator layer 21 at the location of the LV transistor, followed by the deposited of a polysilicon layer 23 over the entire structure.

As an example, layer 21 is a silicon oxide layer. The thickness of layer 21 may be in the range from 1 to 10 nm, for example, 2.5 nm. The thickness of polysilicon layer 23 may be in the range from 60 to 120 nm, for example, 100 nm. Polysilicon 23 may be doped at an implantation step subsequent to its deposition, or in situ as it is being deposited.

Figure 1D:
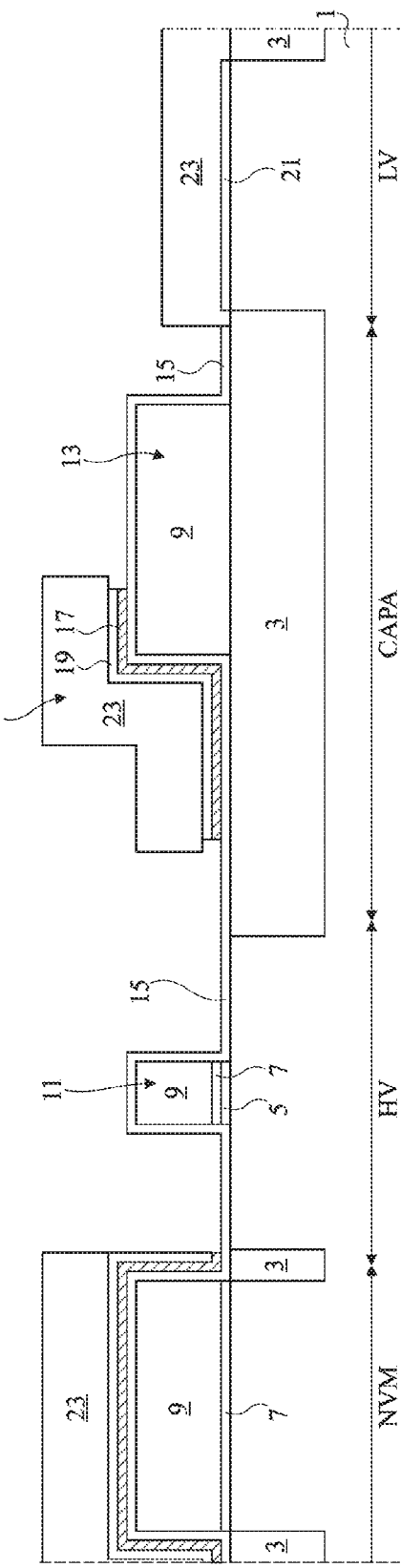

FIG. 1D shows the structure of FIG. 1C after delimitation of second electrode 25 of capacitor CAPA, electrode 25 at least partly resting on electrode 13. To achieve this, at the locations of capacitor CAPA and of the HV transistor, polysilicon layer 23 is removed by etching while a portion of layer 23 corresponding to electrode 25 is left in place, layer 23 being left in place at the location of the NVM and LV transistors. The etching is stopped on silicon nitride layer 17, whereby the portions of silicon oxide layer 19 exposed after the etching of polysilicon 23 are also removed. The portions of nitride layer 17 exposed after the etching of oxide layer 19 are then removed by isotropic etching, for example, by wet etching.

As shown herein, the isotropic etching of nitride layer 17 partially extends under polysilicon 23, on the sides of electrode 25, where nitride layer 17 risks being overetched. Further, on etching of silicon oxide 19 and possibly on etching of silicon nitride layer 17, silicon oxide layer 19 also risks being overetched under the sides of electrode 15. FIG. 1E shows the structure of FIG. 1D after the forming of gate stack 27 of the NVM transistor. To achieve this, at the location of the NVM transistor, layers 23, 19, 17, 15, 9, and 7 are removed by etching while portions of these layers corresponding to gate stack 27 are left in place. During this etch step, layers 23 and 15 are left in place at the locations of capacitor CAPA and of the HV and LV transistors.

FIG. 1F shows the structure of FIG. 1E after the forming of silicon oxide spacers 29 and of silicon nitride spacers 31. To achieve this, a silicon oxide layer 29 is formed by thermal oxidation at least at the locations of capacitor CAPA and of the HV and NVM transistors, after which a silicon nitride layer 31 is conformally deposited on oxide layer 29. Silicon oxide 29 and silicon nitride 31 are then etched by anisotropic etching to form silicon oxide spacers 29 laterally bordering gate stacks 11 and 27 of the HV and NVM transistors, and electrodes 13 and 25 of capacitor CAPA, and to form silicon nitride spacers 31 laterally bordering spacers 29.

Figure 1G:
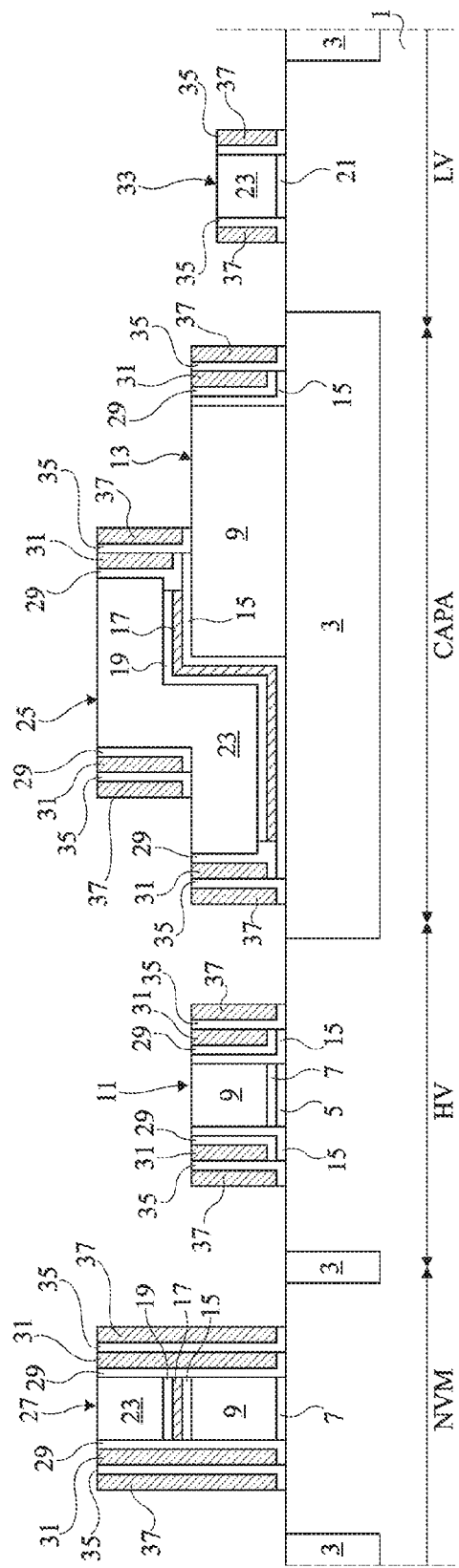

FIG. 1G shows the structure of FIG. 1F after delimitation of gate stack 33 of the LV transistor, followed by the forming of silicon oxide spacers 35 and of silicon nitride spacers 37. To achieve this, at the location of the LV transistor, polysilicon layer 23 and gate insulator layer 21 are removed by etching while portions of these layers corresponding to gate stack 33 are left in place. On forming of gate stack 33, the layers or layer portions already formed at the locations of capacitor CAPA and of the NVM and HV transistors are left in place. After delimitation of gate stack 33, a silicon oxide layer 35 followed by a silicon nitride 37 are conformally formed over the entire structure. Silicon oxide 35 and silicon nitride 37 are then etched by anisotropic etching to form spacers made of silicon oxide 35 and of silicon nitride 37 on the vertical walls of the structure. In particular, silicon oxide spacers 35 laterally border gate stacks 11, 27, and 33 of the HV, NVM, and LV transistors, and electrodes 13 and 25 of capacitor CAPA, and are themselves bordered by silicon nitride spacers 37.

An integrated circuit comprising a capacitor CAPA and NVM, HV, and LV transistors is thus obtained.

A disadvantage of the above-described manufacturing method is that, in the obtained integrated circuit, gate stacks 27 and 11 of the NVM and HV transistors are bordered with the same spacers 29, 31, 35, and 37, while it would be desirable for gate stacks 27 of the NVM transistors to be bordered with a set of spacers thinner than that bordering gate stacks 11 of the HV transistors. Thick spacers are necessary on HV transistors to ensure their breakdown voltage. However, NVM transistors do not need spacers as thick as for HV transistors. Such thick spacers increase the bulk of NVM transistors and decrease the density of the non-volatile memory areas of the integrated circuit.

Another disadvantage of this method is that it provides a thermal oxidation step to replace with thermal oxide 29 insulating layer portions 17 and possibly 19, which are overetched under the sides of electrode 25 during the step described in relation with FIG. 1D. Such a thermal oxidation provides a satisfactory insulation between the two electrodes 13 and 25 of capacitor CAPA, which would not be the case if such overetched portions were replaced with conformally-deposited silicon oxide, for example, by CVD ("Chemical Vapor Deposition"), the insulating properties thereof being poorer than those of thermal silicon oxide.

It would thus be desirable to have a method of manufacturing an integrated circuit which overcomes at least some of the disadvantages of the method described in relation with FIGS. 1A to 1G.

FIGS. 2A to 2F are simplified cross-section views showing a structure at successive steps of an embodiment of a manufacturing method.

FIG. 2A is identical to FIG. 1C and shows the structure obtained after having carried out the steps described in relation with FIGS. 1A to 1C.

FIG. 2B shows the structure of FIG. 2A after delimitation of second electrode 25 of capacitor CAPA, followed by the forming of silicon oxide spacers 39. To achieve this, as described in relation with FIG. 1D, at the location of capacitor CAPA, polysilicon layer 23 is removed by etching while leaving in place a portion of layer 23 corresponding to electrode 25, the latter at least partly resting on electrode 13. During this etching, layer 23 is also removed at the location of the HV transistor. The etching of polysilicon layer 23 carries on with the etching of silicon oxide layer 19, which is stopped on nitride layer 17. A silicon oxide layer 39 is then conformally deposited, at least at the locations of capacitor CAPA and of the HV transistor. Silicon oxide 39 is etched by anisotropic etching to form silicon oxide spacers 39 laterally bordering electrodes 13 and 25 of capacitor CAPA and gate stack 11 of the HV transistor. As an example, the thickness of spacers 39 is in the range from 2 to 25 nm, for example, 15 nm.

Figure 2E:
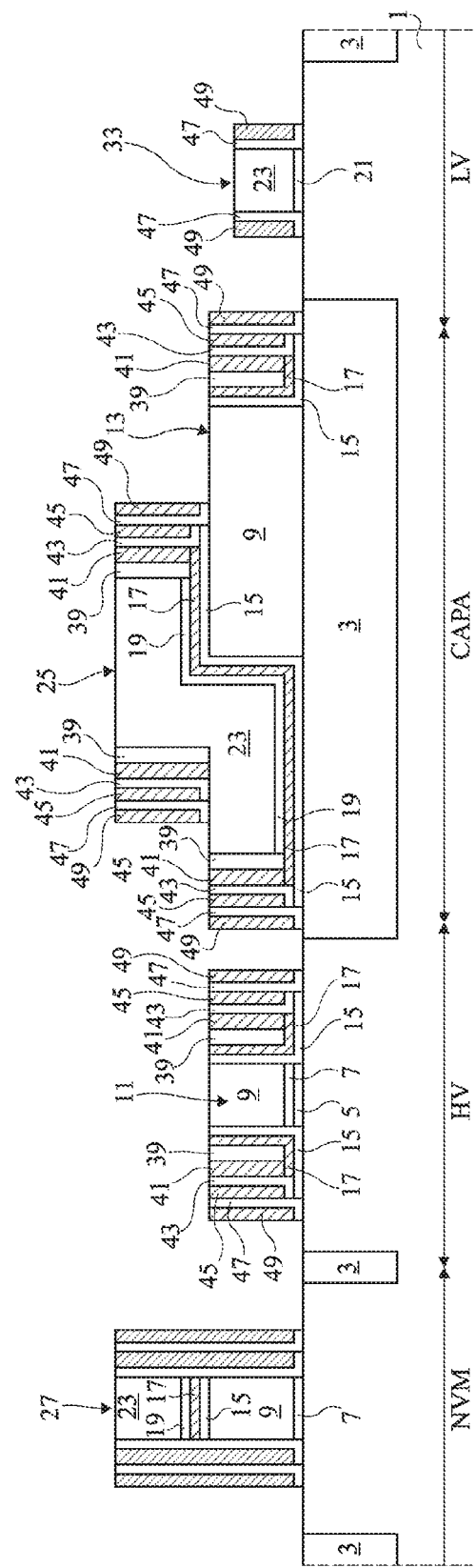

To simplify the drawings, spacers 39 which form against the vertical walls of silicon regions 23 of components NVM and LV are not shown since, as will be seen hereafter, they are removed at a subsequent step (FIGS. 2D and 2E).

FIG. 2C shows the structure of FIG. 2B after the forming of silicon nitride spacers 41. To achieve this, a silicon nitride layer 41 is conformally deposited, at least at the locations of capacitor CAPA and of the NVM and HV transistors. Silicon nitride 41 is then etched by anisotropic etching to form silicon nitride spacers 41 laterally bordering silicon oxide spacers 39 of the HV and NVM MOS transistors and of electrodes 13 and 25 of capacitor CAPA. During the etching of silicon nitride 41, portions of silicon nitride layer 17 are exposed and are also removed. As an example, the thickness of spacers 41 is in the range from 10 to 100 nm, for example, 50 nm.

To simplify the drawings, spacers 41 which form against the vertical walls of components NVM and LV are not shown since, as will be seen hereafter, they are removed at a subsequent step (FIGS. 2D and 2E).

Due to the fact that the etching of silicon nitride 41 and 17 is an anisotropic etching and, further, that spacers 39 are formed before this etching, silicon nitride layer 17 is not overetched under the sides of electrode 25. On the contrary, nitride layer 17 extends on either side of electrode 25, at least under spacers 39 and possibly under spacers 41, layer 15 also extending under spacers 39 and possibly under spacers 41. The electric insulation between electrodes 13 and 25 of capacitor CAPA is then satisfactorily ensured by the succession of oxide layer 15, of nitride layer 17, and of oxide layer 19, and, conversely to the method described in relation with FIGS. 1A to 1G, it is not necessary to provide a thermal oxidation step.

FIG. 2D shows the structure of FIG. 2C after delimitation of gate stack 27 of the NVM transistor, followed by the forming of silicon oxide spacers 43 and of silicon nitride spacers 45. Gate stack 27 is formed in the same way as described in relation with FIG. 1E. After delimitation of gate stack 27, a silicon oxide layer 43 and a silicon nitride layer 45 are successively and conformally deposited at least at the locations of capacitor CAPA and of the NVM and HV transistors. Silicon nitride 45 and silicon oxide 43 are then etched by anisotropic etching to form silicon oxide spacers 43 laterally bordering gate stacks 11 and 27 of the HV and NVM transistors, and electrodes 13 and 25 of capacitor CAPA, and to form silicon nitride spacers 45 laterally bordering spacers 43. As an example, the thickness of spacers 43 is in the range from 4 to 18 nm, for example 12 nm. The thickness of spacers 45 may be in the range from 3 to 10 nm, for example, 5 nm.

To simplify the drawings, spacers 43, 45 which form against the vertical walls of the LV components, are not shown since, as will be seen hereafter, they are removed at the next step (FIG. 2E).

FIG. 2E shows the structure of FIG. 2D after delimitation of gate stack 33 of the LV transistor followed by the forming of silicon oxide spacers 47 and of silicon nitride spacers 49. Gate stack 33 is formed in the same way as described in relation with FIG. 1G. After delimitation of gate stack 33, a silicon oxide layer 47 and a silicon nitride 49 are successively and conformally formed over the entire structure. Silicon nitride 49 and silicon oxide 47 are then etched by anisotropic etching to form silicon oxide spacers 47 and silicon nitride spacers 49. More particularly, spacers 47 laterally border gate stacks 11, 27, and 33 of the HV, NVM, and LV transistors, and electrodes 13 and 25 of capacitor CAPA, and are themselves bordered with silicon nitride 49. As an example, the thickness of spacers 47 is in the range from 1 to 8 nm, for example, 5 nm. The thickness of spacers 49 may be in the range from 10 to 40 nm, for example, 25 nm.

An integrated circuit comprising a capacitor CAPA and transistors of different types, that is, NVM, HV, and LV transistors, are thus obtained. In this circuit, spacers 47 and 49 bordering gate stacks 33 of the LV transistors also border gate stacks 11 and 27 of the HV and NVM transistors and electrodes 13 and 25 of capacitor CAPA, spacers 43 and 45 bordering gate stacks 27 of the NVM transistors also border gate stacks 11 of the HV transistors and electrodes 13 and 25 of capacitor CAPA, and spacers 39 and 41 only border gate stacks 11 of the HV transistors and electrodes 13 and 25 of capacitor CAPA. Thus, the set of spacers bordering the gate stacks of the NVM transistors is at least as thick as that bordering the gate stacks of the HV transistors, which enables to form thinner NVM transistors, and thus denser NVM memory areas. Further, the set of spacers bordering the gate stacks of the LV transistors is itself thinner than that bordering the gate stacks of the NVM transistors, since these transistors are not intended to be submitted to high voltages, which provides logic areas (LV) of optimal density.

As already emphasized in relation with FIG. 2C and conversely to the method described in relation with FIGS. 1A to 1G, the method described in relation with FIGS. 2A to 2E enables to avoid using a thermal oxidation step to electrically insulate electrodes 13 and 25 from each other, the electric insulation between these electrodes being satisfactorily achieved by the stack of layers 15, 17, and 19.

As an example, the NVM transistors are intended to operate at voltages in the range from 2 to 5 V. The HV transistors are for example intended to operate at voltages in the range from 6 to 12 V. The LV transistors are for example intended to operate at voltages in the range from 1 to 4 V. Capacitor CAPA is intended to provide, between its two electrodes 13 and 25, a voltage difference in the range from 4 to 8 V.

Specific embodiments have been described. Various alterations, modifications, and improvements will occur to those skilled in the art. In particular, although the steps of doping to form the drain, source, and channel regions of the NVM, HV, and LV MOS transistors have not been described, it will be within the abilities of those skilled in the art to integrate these steps in the previously-described embodiment.

Above-described capacitor CAPA comprises two electrodes 25 and 13 resting on an insulating structure 3. These electrodes may also rest on a doped layer of a first conductivity type formed in a region of semiconductor layer 1 doped with the second conductivity type. In this case, electrode 25 of capacitor CAPA and the doped region of the second conductivity type may be electrically connected.

Although in the drawings illustrating the previously-described manufacturing method, a single transistor of each of types HV, NVM, and LV and a single capacitor have been shown, it should be understood that a plurality of transistors of each type and/or a plurality of capacitors CAPA may be simultaneously formed on implementation of this method.

The materials and thicknesses previously indicated as an example may be adapted by those skilled in the art. For example, although silicon oxide gate insulator layers 5, 7, and 21 have been described, each of these layers may be made of another insulating material currently used to form gate insulators, for example, of a so-called "high k" material having a higher dielectric constant that silicon oxide. The semiconductor layer may be made of another semiconductor material than silicon, for example, of silicon-germanium. Further, the semiconductor layer may correspond to a semiconductor layer of an SOI-type structure ("Semiconductor On Insulator"), that is, a semiconductor layer resting on an insulating layer, itself resting on a substrate.

The order and the number of the steps of the above-described method may be modified. For example, to form the gate insulators of the HV and NVM transistors, it may be provided to only form layer 5 at the locations of the NVM transistors, and then layer 7 at the locations of the HV transistors by using adapted masking layers.

It will be within the abilities of those skilled in the art to adapt the steps following the steps of FIGS. 2A and 2B while keeping the advantages of the above-described method, that is, the insulation between electrodes 13 and 25 of the capacitor is performed by layers 15, 17, and 19, and the spacers of the transistors formed after the steps of FIGS. 2A and 2B border the gate stack of the HV transistor and electrodes 13 and 25 of capacitor CAPA. Thus, in addition to the HV transistor and to capacitor CAPA, it will be within the abilities of those skilled in the art to form transistors other than NVM and/or LV transistors. Those skilled in the art may also provide manufacturing an integrated circuit only comprising HV transistors and a capacitor CAPA.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit comprising at least one high-voltage MOS (HV) transistor, and at least one capacitor, wherein:
   a gate stack of the HV transistor comprises a first insulating layer over a semiconductor layer and a gate electrode made of a first polysilicon layer;
   the capacitor comprises a first electrode made of the first polysilicon layer over the semiconductor layer, a second electrode made of a second polysilicon layer extending at least partly over the first electrode, and a stack comprising a first silicon oxide layer coated with a silicon nitride layer that is coated with a second silicon oxide layer, said stack extending between the second electrode and the semiconductor layer and further extending between the second electrode and the first electrode;
   first spacers made of silicon oxide laterally bordering the second electrode and the gate stack of the HV transistor; and
   second spacers made of silicon nitride laterally bordering the first spacers,
   wherein the first silicon oxide layer and the silicon nitride layer extend beyond sides of the second electrode and underneath the first and second spacers laterally bordering the second electrode; and
   wherein the first silicon oxide layer and the silicon nitride layer also extend between the first spacers and sides of the gate stack of the HV transistor, and further extend underneath the first and second spacers laterally bordering the gate stack of the HV transistor.

2. The integrated circuit of claim 1, further comprising at least one floating-gate MOS (NVM) transistor, wherein:
   a gate stack of the NVM transistor comprises a second insulating layer over the semiconductor layer and a first gate electrode made of the first polysilicon layer, and a second gate electrode made of the second polysilicon layer, with the second oxide layer, the nitride layer, and the first oxide layer positioned between the first and second gate electrodes; and third spacers laterally bordering the gate stack of the NVM transistor, said third spacers further laterally bordering the second spacers at the HV transistor and the second electrode of the capacitor.

3. The integrated circuit of claim 2, further comprising at least one low-voltage MOS (LV) transistor, wherein:
a gate stack of the LV transistor comprises a third insulating layer over the semiconductor layer and a gate electrode made of the second polysilicon layer; and
fourth spacers laterally bordering sides of the gate stack of the LV transistor and the third spacers at the HV transistor and the second electrode of the capacitor.

4. An integrated circuit, comprising:
a semiconductor substrate including a first semiconducting region and an insulating region;
a high voltage transistor including a gate stack formed over the first semiconducting region, the gate stack of the high voltage transistor including a gate electrode formed of a first polysilicon material; and
a capacitor formed over the insulating region, the capacitor including a first plate formed of the first polysilicon material and a second plate formed of a second polysilicon material and an insulating material layer positioned between the first and second plates, wherein the insulating material layer extends beyond sidewalls of the second plate and is further positioned on sidewalls of the gate stack of the high voltage transistor;
wherein the first polysilicon material of the gate stack of the high voltage transistor and first plate of the capacitor are patterned from a first polysilicon layer over said semiconductor substrate and the second polysilicon material of the second plate is formed from a second polysilicon layer over the first polysilicon layer; and
sidewall spacer structures laterally bordering the insulating material layer on sidewalls of the gate stack of the high voltage transistor and on sidewalls of the first and second plates of the capacitor, said sidewall spacer structures positioned over the insulating material layer that extends beyond sidewalls of the second plate.

5. The integrated circuit of claim 4, wherein the semiconductor substrate further includes a second semiconducting region and further comprising:
a non-volatile memory transistor including a gate stack formed over the second semiconducting region, the gate stack of the non-volatile memory transistor including a floating gate electrode formed of the first polysilicon material and a control gate electrode formed of the second polysilicon material,
wherein the first polysilicon material of the gate stack of the high voltage transistor, the floating gate electrode of the non-volatile memory transistor and the first plate of the capacitor are patterned from the first polysilicon layer; and
wherein the second polysilicon material of the control gate electrode of the non-volatile memory transistor and the second plate of the capacitor are patterned from the second polysilicon layer.

6. The integrated circuit of claim 5, wherein the insulating material layer between the first and second plates of the capacitor is further present between the floating gate electrode and control gate electrode of the non-volatile memory transistor.

7. The integrated circuit of claim 5:
wherein the sidewall spacer structures are not present laterally bordering the gate stack of the non-volatile memory transistor; and further comprising:
additional sidewall spacer structures laterally bordering the sidewall spacer structures at the first and second plates of the capacitor and the high voltage transistor, said additional sidewall spacer structures further positioned on sidewalls of the gate stack of the non-volatile memory transistor.

8. The integrated circuit of claim 7, wherein the additional sidewall spacer structures laterally bordering the sidewall spacer structures at the second plate are positioned over the insulating material layer that extends beyond sidewalls of the second plate.

9. The integrated circuit of claim 4, wherein the semiconductor substrate further includes a second semiconducting region and further comprising:
a low voltage transistor including a gate stack formed over the second semiconducting region, the gate stack of the low voltage transistor including a gate electrode formed of the second polysilicon material,
wherein the second polysilicon material of the gate electrode of the low voltage transistor and second plate of the capacitor are patterned from the second polysilicon layer.

10. The integrated circuit of claim 9, further comprising:
additional sidewall spacer structures positioned adjacent sidewalls of the gate stack of the low voltage transistor.

11. An integrated circuit, comprising:
a semiconductor substrate including a first semiconducting region and an insulating region;
a high voltage transistor including a gate stack formed over the first semiconducting region, the gate stack of the high voltage transistor including a gate electrode formed of a first polysilicon material;
a capacitor formed over the insulating region, the capacitor including a first plate formed of the first polysilicon material and a second plate formed of a second polysilicon material and an insulating material layer positioned between the first and second plates, wherein the insulating material layer extends beyond sidewalls of the second plate and is further positioned on sidewalls of the gate stack of the high voltage transistor;
wherein the first polysilicon material of the gate stack of the high voltage transistor and first plate of the capacitor are patterned from a first polysilicon layer over said semiconductor substrate and the second polysilicon material of the second plate is formed from a second polysilicon layer over the first polysilicon layer; and
first sidewall spacer structures laterally bordering the insulating material layer on sidewalls of the gate stack of the high voltage transistor and on sidewalls of the first and second plates of the capacitor, said first sidewall spacer structures positioned over the insulating material layer that extends beyond sidewalls of the second plate,
wherein the first sidewall spacer structures are formed from a nitride layer and an oxide layer.

12. The integrated circuit of claim 11, wherein the semiconductor substrate further includes a second semiconducting region and further comprising:
a non-volatile memory transistor including a gate stack formed over the second semiconducting region, the gate stack of the non-volatile memory transistor including a floating gate electrode formed of the first polysilicon material and a control gate electrode formed of the second polysilicon material,
wherein the first polysilicon material of the gate stack of the high voltage transistor, the floating gate electrode of the non-volatile memory transistor and the first plate of the capacitor are patterned from the first polysilicon layer; and wherein the second polysilicon material of the control gate electrode of the non-volatile memory transistor and the second plate of the capacitor are patterned from the second polysilicon layer.

13. The integrated circuit of claim 12, wherein the insulating material layer between the first and second plates of the capacitor is further present between the floating gate electrode and control gate electrode of the non-volatile memory transistor.

14. The integrated circuit of claim 12:
wherein the first sidewall spacer structures are not present laterally bordering the gate stack of the non-volatile memory transistor; and further comprising:
second sidewall spacer structures laterally bordering the first sidewall spacer structures at the first and second plates of the capacitor and the high voltage transistor, said second sidewall spacer structures further positioned on sidewalls of the gate stack of the non-volatile memory transistor,
wherein the second sidewall spacer structures are formed from a nitride layer and an oxide layer.

15. The integrated circuit of claim 14, wherein the second sidewall spacer structures laterally bordering the first sidewall spacer structures at the second plate are positioned over the insulating material layer that extends beyond sidewalls of the second plate.

16. The integrated circuit of claim 14, further comprising third sidewall spacer structures laterally bordering the second sidewall spacer structures at the second plate, the high voltage transistor and the non-volatile memory transistor, wherein the third sidewall spacer structures are formed of a nitride layer and an oxide layer.

17. The integrated circuit of claim 14, wherein the semiconductor substrate further includes a third semiconducting region and further comprising:
a low voltage transistor including a gate stack formed over the third semiconducting region, the gate stack of the low voltage transistor including a gate electrode formed of the second polysilicon material,
wherein the second polysilicon material of the gate electrode of the low voltage transistor, control gate electrode of the non-volatile memory transistor and second plate of the capacitor are patterned from the second polysilicon layer.

18. The integrated circuit of claim 17, further comprising: third sidewall spacer structures laterally bordering the second sidewall spacer structures at the second plate, the high voltage transistor and the non-volatile memory transistor, said third sidewall spacer structures further positioned on sidewalls of the gate stack of the low voltage transistor,
wherein the third sidewall spacer structures are formed from a nitride layer and an oxide layer.

19. The integrated circuit of claim 18, wherein the first and second sidewall spacer structures are not present laterally bordering the gate stack of the low voltage transistor.

20. An integrated circuit, comprising:
a substrate;
a high-voltage transistor supported by the substrate and including a gate stack with a gate electrode formed from a first polysilicon layer;
a capacitor supported by the substrate and including a first electrode formed from the first polysilicon layer, a second electrode formed from a second polysilicon layer over said first polysilicon layer and a capacitor insulator positioned between the first and second electrodes, said capacitor insulator formed by a first silicon oxide layer that is coated with a first silicon nitride layer;
first sidewall spacers on sidewalls of the gate stack of the high-voltage transistor, wherein said first sidewall spacers are formed from the first silicon oxide layer and first silicon nitride layer of said capacitor insulator;
second sidewall spacers on sidewalls of the second electrode and laterally bordering the first sidewall spacers at the gate stack of the high-voltage transistor, wherein the second sidewall spacers are formed from a second silicon oxide layer that is coated with a second silicon nitride layer;
wherein the first silicon oxide layer and the first silicon nitride layer of said capacitor insulator extend beyond sidewalls of the second electrode and underneath the second sidewall spacers at the second electrode; and
wherein the first silicon oxide layer and the first silicon nitride layer forming the first spacers extend underneath the second sidewall spacers at the gate stack of the high-voltage transistor.

21. The integrated circuit of claim 20, further comprising:
a floating-gate transistor supported by the substrate and including a gate stack with a first gate electrode formed from the first polysilicon layer and a second gate electrode formed from the second polysilicon layer, a gate insulator positioned between the first and second gate electrodes, said gate insulator formed by the first silicon oxide layer and first silicon nitride layer of the capacitor insulator; and
third sidewall spacers on sidewalls of the gate stack of the floating-gate transistor, wherein said third sidewall spacers are formed from a third silicon oxide layer that is coated with a third silicon nitride layer;
wherein said third sidewall spacers further laterally border the second sidewall spacers at the high-voltage transistor and capacitor.

22. The integrated circuit of claim 21, further comprising:
a low-voltage transistor supported by the substrate and including a gate stack with a gate electrode formed from the second polysilicon layer; and
fourth sidewall spacers on sidewalls of the gate stack of the low-voltage transistor, wherein said fourth sidewall spacers are formed from a fourth silicon oxide layer that is coated with a fourth silicon nitride layer;
wherein said fourth sidewall spacers further laterally border the third sidewall spacers at the high-voltage transistor, the capacitor and the floating-gate transistor.

\* \* \* \* \*